United States Patent [19]

Sakashita et al.

[11] Patent Number: 4,825,439
[45] Date of Patent: Apr. 25, 1989

[54] SEMICONDUCTOR LOGIC INTEGRATED CIRCUIT DEVICE HAVING FIRST AND SECOND OPERATION MODES FOR TESTING

[75] Inventors: Kazuhiro Sakashita; Satoru Kishida; Toshiaki Hanibuchi, all of Hyogo, Japan

[73] Assignee: Mitsubishi Denki Kabushiki Kaisha, Tokyo, Japan

[21] Appl. No.: 86,447

[22] Filed: Aug. 18, 1987

[30] Foreign Application Priority Data

Aug. 22, 1986 [JP] Japan ................................ 61-197587

[51] Int. Cl.⁴ .......................................... G01R 31/28
[52] U.S. Cl. ...................................... 371/15; 371/25; 324/73 AT; 377/54
[58] Field of Search ....................... 377/54, 55, 56, 42, 377/70, 75, 29; 324/73 AT; 371/15, 25

[56] References Cited

U.S. PATENT DOCUMENTS

| | | | |
|---|---|---|---|
| 4,139,818 | 2/1979 | Schneider | 324/73 AT |
| 4,498,174 | 2/1985 | Le Gresley | 371/25 |
| 4,581,740 | 4/1986 | Kinoshita | 371/25 |
| 4,648,104 | 3/1987 | Yachida et al. | 377/54 |
| 4,698,588 | 10/1987 | Hwang et al. | 371/25 |

*Primary Examiner*—John S. Heyman
*Attorney, Agent, or Firm*—Nixon & Vanderhye

[57] ABSTRACT

A semiconductor logic integrated circuit device comprising a signal selection means and a storing means, which is capable of adjusting the logic levels of an output signal therefrom. With such a circuit device, the signal selection means and the storing means are controlled in normal operation mode so that a parallel input signal is allowed to be output as a parallel output signal from output terminals of the circuit device after subjecting the parallel input signal to logical signal processing. On the other hand, the signal selection means and the storing means are controlled in a testing opertion mode so that the parallel input signal are output in serial mode from a serial signal output terminal of the circuit device, and a serial input signal to the signal selection means is allowed to be stored in the storing means to adjust the logic levels of the output signal from the circuit device at desired levels voluntarily.

9 Claims, 3 Drawing Sheets

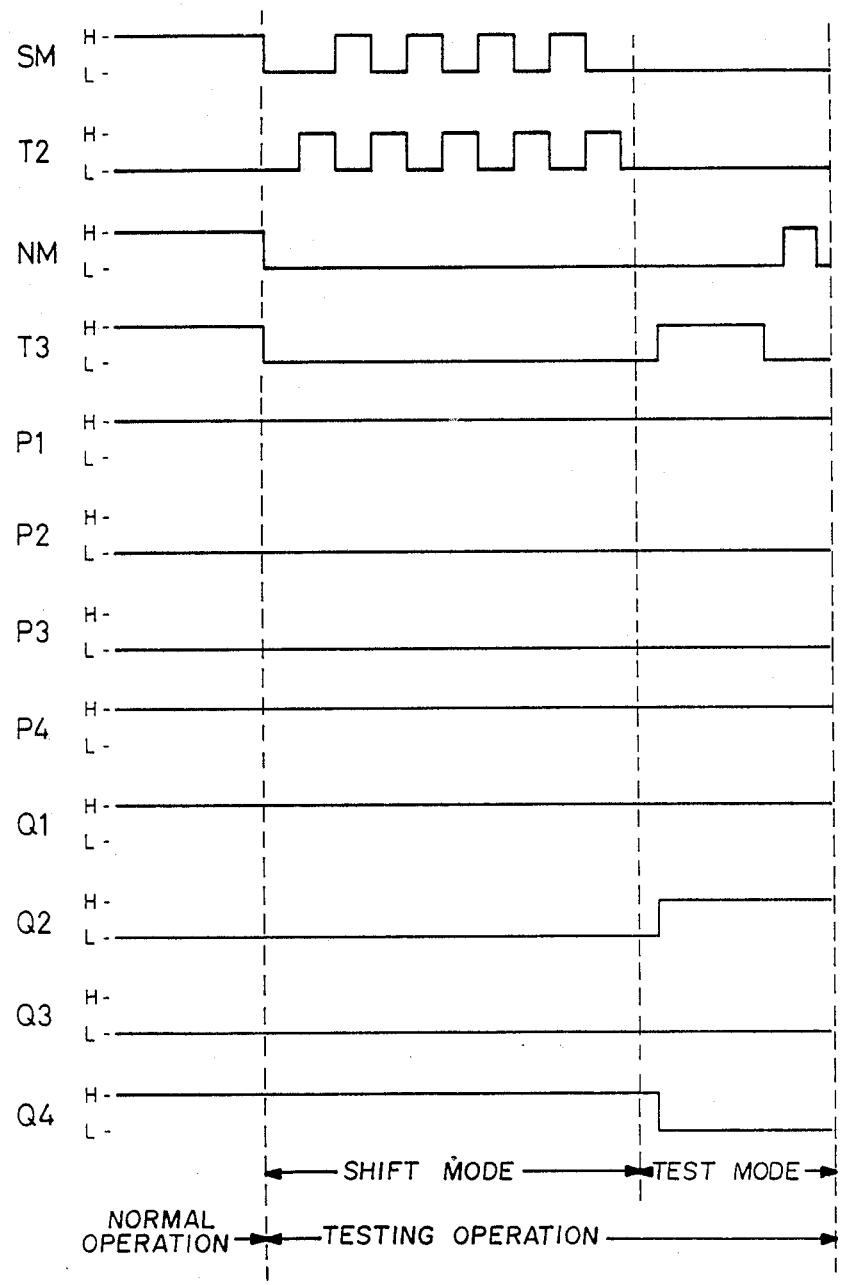

SEMICONDUCTOR LOGIC INTEGRATED CIRCUIT DEVICE HAVING FIRST AND SECOND OPERATION MODES FOR TESTING

FIELD OF THE INVENTION

The present invention relates to a semiconductor logic integrated circuit device, and more particularly to a signal selection circuit included therein.

BACKGROUND OF THE INVENTION

In order to explain the background of the present invention, reference will be first made to FIG. 1 which is a block diagram showing a conventional semiconductor logic integrated circuit device ( hereinafter referred to as an IC device ). In FIG. 1, input buffers ($IB_1$) to ($IB_4$) receive input signals in parallel, respectively, which are supplied from an external signal supply unit ( not shown ) to input terminals ($I_1$) to ($I_4$), and the parallel outputs of the input buffers ($IB_1$) to ($IB_4$) are then applied to a logic unit (LG) to be subjected to logical signal processing. Output signals $P_1$ to $P_4$ of the logic unit (LG) are output through output buffers ($OB_1$) to ($OB_4$) to output terminals ($O_1$) to ($O_4$), respectively. Electric power is supplied to the above described elements through a common power supply terminal and a common power supply line ( not shown ).

To test and evaluate the IC device, the IC device is coupled to a testing device ( hereinafter referred to as a tester ) so that a test pattern signal is applied to the input terminals ($I_1$) to ($I_4$), and the logical verification of the IC device is accomplished based on the output logic levels at the output terminals ($O_1$) to ($O_4$) in response to the input of the test pattern signal.

With such a conventional IC device as described above, variation in power supply current—which may be caused by variations in the output logic levels of the output buffers ($OB_1$) to ($OB_4$)—is relatively larger than that which may be caused by the other circuit elements. Therefore, when a large number of output signals switch their logic levels to either high logic level (H) or low logic level (L) simultaneously the power supply current varies remarkably in response to the switch. This results in variation in power voltage which may be caused by the above described transient variation of the power supply current and a distributed inductance which exists along circuit elements including coupling members for coupling the IC to be tested to the tester, jigs such as a performance board and wiring in the tester.

Since the logic levels of the test pattern signal which is applied to the input terminals ($I_1$) to ($I_4$) are determined based on the voltage level of a voltage appearing at a common terminal of the tester, there is a possibility that the variation in the power supply voltage may be superposed on the test pattern signal as noise, resulting in a decrease in the input operation margin of the IC device. In the worst case, this results in an occurrence of errors in the logical operation thereof.

In order to overcome the above described drawbacks, a test pattern signal may be used which does not cause the output levels of the output signals from the IC device to vary simultaneously. In this case, however, such a test pattern signal may not meet the logical processing condition of the IC device to be tested, and therefore is not practical to use for fully testing the IC.

The conventional semiconductor logic integrated circuit device thus constructed is disadvantageous in that, since it is necessary to apply a test pattern signal to the input terminals of the IC device successively in order to determine the logic levels of the output signal therefrom, a relatively long period of time is required to carry out the test operation, and a decrease in the input operation margin may occur due to the variation in the power supply voltage which may be caused by the abrupt and simultaneous variation of the output signal levels in the same potential direction.

SUMMARY OF THE INVENTION

To overcome the above described drawbacks and difficulties accompanying the prior art devices, the present invention provides a semiconductor logic integrated circuit device having a signal selection circuit which is capable of freely adjusting the logic levels of an output signal therefrom to thereby shorten a period of time required for a test operation. The signal selecting circuit is thus capable of preventing the occurrence of decreasing of an input operation margin caused by simultaneous variation in logic levels of output signals from output buffers in the same potential direction.

According to one embodiment of the present invention, shift registers each having a signal selection function, which are coupled in a cascade connection, are connected to output terminals of a logic unit contained in a semiconductor logic integrated circuit device, respectively, and further temporary storing circuits are coupled between the shift registers and output buffers of the IC device, respectively.

A semiconductor logic integrated circuit device according to the present invention is provided with such shift registers and temporary storing circuits. An output parallel signal from the logic unit can be output in a serial mode from a shift-out terminal of the IC device, and logic input signals which are applied through shift-in terminals of the shift registers can be stored in the temporary storing circuits—whereby it is possible to maintain the output levels of output signals from the output buffers unchanged even though the logic levels of the output signals from the logic unit vary.

To this end, it is possible to prevent the logic levels of the parallel output signals from the output buffers from varying simultaneously. Further, since the logic levels thereof from the output buffers can be determined voluntarily by setting the logic levels of the logic input signals to the shift-in terminals of the shift registers voluntarily, it is unnecessary to apply a test pattern signal to the respective input terminals of the logic unit in order to determine the logic levels of the output signal during a DC test, resulting in shortening the test period duration.

The above and other objects, features and advantages of the present invention will become more apparent from the following description when taken in conjunction with the accompanying drawings in which a preferred embodiment of the present invention is shown by way of illustrative example.

BRIEF DESCRIPTION OF THE DRAWINGS

In the accompanying drawings:

FIG. 3 is a timing chart graphically illustrating the operation of the device shown in FIG. 2.

DETAILED DESCRIPTION OF THE PREFERRED EMBODIMENT

A preferred embodiment of the present invention will be described hereinbelow with reference to FIGS. 2 to 4.

Figure 2:
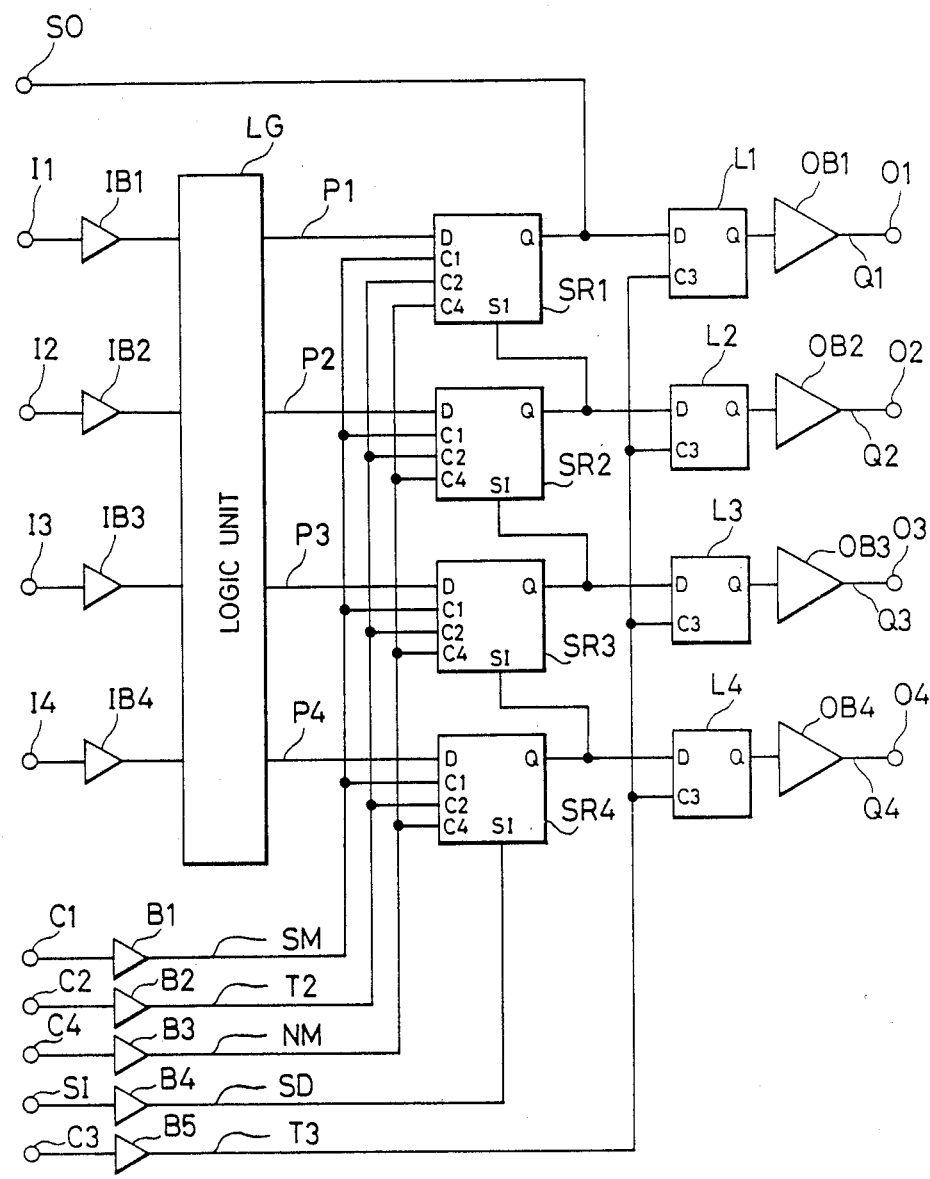
FIG. 2 is a circuit diagram showing a presently preferred exemplary embodiment of a semiconductor logic integrated circuit device according to the present invention.

FIG. 2 is a circuit diagram showing the preferred embodiment of the present invention and FIG. 3 is a timing chart showing waveforms of signals appearing in the embodiment of FIG. 2.

Figure 4:
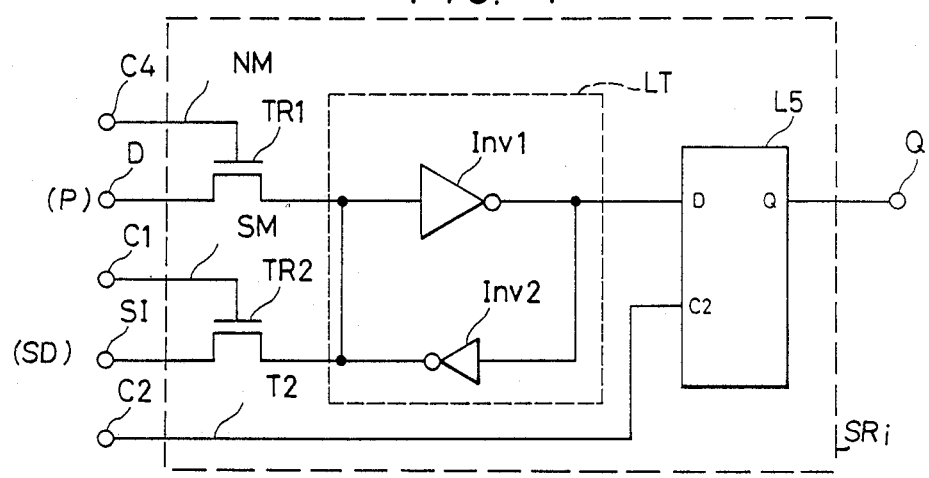
FIG. 4 is a circuit diagram schematically showing shift registers ($SR_1$) to ($SR_4$) shown in FIG. 2.

In FIG. 2, designated by reference characters ($SR_1$) to ($SR_4$) are shift registers, respectively, each detailed circuit construction of which is shown in FIG. 4. ($L_1$) to ($L_4$) denote latches each having a signal transmission function. ($C_1$) to ($C_4$ are input terminals for receiving control signals, (SI) is a shift-in terminal for receiving logic input signals, and ($B_1$) to ($B_5$) are input buffers.

Figure 1:
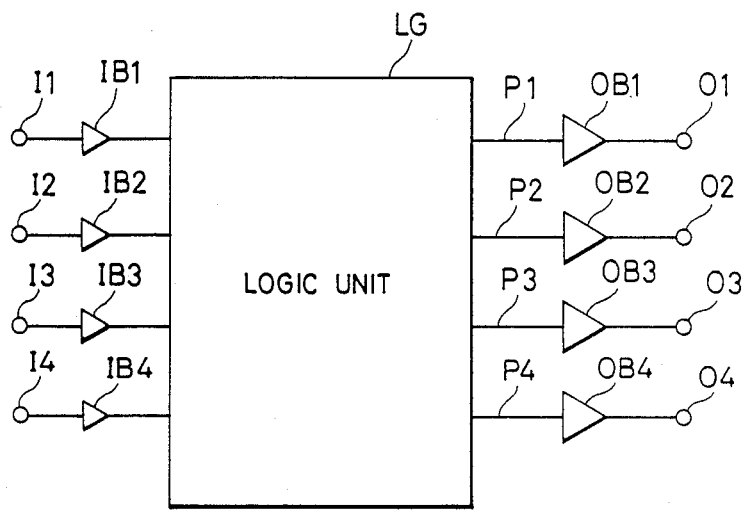
FIG. 1 is a circuit diagram of a conventional semiconductor logic integrated circuit device.

In FIG. 2, circuit components which are identical or correspond to those in FIG. 1 bear the same reference numerals or characters.

In FIG. 4 (which shows an exemplary configuration for each of shift registers SR1–SR4 of FIG. 2) reference characters ($TR_1$) and ($TR_2$) denote transmission gates; ($Inv_1$) and ($Inv_2$) are inverters constituting a latch (LT), and ($L_5$) is a data latch.

The operation of the circuit shown in FIG. 4 will now be described with reference to FIG. 4.

Each of the shift registers ($SR_1$) to ($SR_4$) operates as follows. When a normal mode signal NM applied to the input terminal ($C_4$) is "L" (logic level "low"), a serial data SD input to the shift-in terminal (SI) is held in the latch (LT) in synchronization with a shift mode signal SM applied to the input terminal ($C_1$). On the other hand, when the signal SM is at level "L", an output signal $P_1$, $P_2$, $P_3$ or $P_4$ from the logic unit (LG), which is applied to the terminal (D), is held in the latch (LT) in synchronization with the signal NM from the input terminal ($C_4$). The signal which has been held in the latch (LT), is then allowed to be transmitted to the data latch ($L_5$) in synchronization with an input signal $T_2$ applied to the input terminal ($C_2$) so as to be held therein. The signal held in the latch ($L_5$) is transmitted to the following latch ($L_1$), ($L_2$), ($L_3$) or ($L_4$) in synchronization with an input signal $T_3$ applied to the input terminal ($C_3$) to be held therein.

In the device as shown in FIG. 2, during a normal operation (not testing operation), the shift mode signal SM applied to the input terminal ($C_1$) is set to "L" whereas the input signals $T_2$ and $T_3$ applied to the input terminals $C_2$ and $C_3$, respectively, and the normal mode signal NM applied to the input terminal $C_4$ are set to "H". As a result, the transmission of the output signal $P_1$, $P_2$, $P_3$ or $P_4$ which is output from the logic unit LG is allowed from the input terminal (D) to the output terminal (Q) in each of the shift registers $SR_1$ to $SR_4$. Further, in the respective latches $L_1$ to $L_4$, the output signals of the respective shift registers $SR_1$ to $SR_4$ which are applied to input terminals of the latches $L_1$ to $L_4$ are allowed to pass therethrough to output terminals Q thereof. Consequently the output signals $P_1$ to $P_4$ from the logic unit LG can be transmitted to the output terminals ($O_1$) to ($O_4$) of the circuit device (the shift registers SR and data latches L being transparent during normal use) and therefore a desired normal operation of the circuit device is carried out. More concretely, when the output signals $P_1$ to $P_4$ are "H", "L", "L" and "H" respectively as shown in FIG. 3, the output levels of the signals from the buffers ($OB_1$) to ($OB_4$) are also "H", "L", "L" and "H".

The operation when the normal mode signal NM applied to the input terminal ($C_4$) is set to "L", will be described.

In this case the application of the output signals $P_1$ to $P_4$ from the logic unit LG is blocked by the transmission gate $TR_1$ (FIG. 4), output is accomplished by applying input signals as a clock signal to the input terminals ($C_1$) and ($C_2$) to shift-in logic input signals through the shift-in terminals (SI) or to shift-signals out through the serial output terminal SO.

When the normal mode signal NM is set to "L", the output signals $P_1$ to $P_4$ from the logic unit (LG) are held in the latches (LT) in the shift registers ($SR_1$) to ($SR_4$), respectively. Then, upon the application of the following clock signal ($T_2$) to the input terminal ($C_2$), the signals $P_1$ to $P_4$ are transmitted to the latches ($L_5$) to be held therein. At the same time, the output signal ($P_1$)( "H" in FIG. 2(e)) is output from the output terminal (SO).

Assuming that the serial input signal of "H", "H", "L" and "L" in this order is applied to the shift-in terminal (SI), when the clock signal (SM) applied to the input terminal ($C_1$) advances once, the input logic signal of "H" from the shift-in terminal (SI) is transmitted to the latch (LT) of the shift register ($SR_4$) to be held therein. At the same time, applied to the latches (LT) of the shift registers ($SR_3$) to ($SR_1$) are the output signals ($P_4$) to ($P_2$), respectively. That is, the signals of "H", "L" and "L" are held in the latches (LT) of the shift registers ($SR_3$) to ($SR_1$) in this order. As described above, by applying the clock signals of "H" to the input terminals ($C_1$) and ($C_2$) alternately, the logic input signals "H", "H", "L" and "L" which are applied to the shift-in terminals of the shift registers ($SR_1$) to ($SR_4$) in this order, can be held in the latches ($L_5$) thereof, respectively. Simultaneously, the output signals $P_1$ to $P_4$ from the logic unit (LG) can be read out from the output terminal (SO) in serial mode.

In FIG. 2, upon the application of the next clock signal $T_2$, the signals which have been held in the latches ($L_5$) of the shift registers ($SR_1$) to ($SR_4$), respectively, are allowed to be output through the respective output terminals (Q) resulting in variations of the logic levels. In this case, however, if the input signal $T_3$ applied to the input terminal ($C_3$) is set to "L", the output levels of the buffers ($OB_1$) to ($OB_4$) are continuously held at the levels, respectively, that are same as those which are obtained upon the application of the preceding clock signal $T_2$. On the other hand, if the input signal $T_3$ is applied to the input terminal ($C_3$) as a new clock signal, as shown in FIG. 2, the signals of "H", "H", "L" and "L" which have been held in the data latches ($L_5$) of the shift registers ($SR_1$) to ($SR_4$), are allowed to be transmitted to the latches ($L_1$) to ($L_4$) to be held therein. Consequently, the signals of "H", "H", "L" and "L" can be output from the output terminals ($O_1$) to ($O_4$), respectively as outputs $Q_1$ to $Q_4$.

While a data latch is employed as a temporary storing circuit in the above described embodiment, modifications therefor are possible. That is, another logic circuit which has the same function can be used to realize the same function of the IC device.

Further, although a concrete example of a shift register which is employed in the present invention is shown in FIG. 4, the shift register can be also replaced by another logic circuit having the same shift-function.

As is apparent from the above, according to the present invention, a shift register and a temporary storing circuit are provided between an output terminal of a logic unit and an output buffer corresponding to the output terminal, the shift registers being coupled in a cascade manner. With such a circuit construction described above, it is possible to read out the parallel outputs from the logic unit in serial mode by the function of the shift registers under the condition that the output levels appearing at output terminals of a semiconductor logic IC device are maintained unchanged. Consequently, there is no possiblity that the output levels of the IC device are varied in the same potential direction simultaneously—thereby eliminating undesired variation in a power supply current. As a result, the variation in the power supply voltage is also suppressed to thereby prevent an occurrence of errors in the operation of the IC device. Further, since voluntary signals can be held in the temporary storing circuits through the shift registers, it is possible to adjust the output logic levels of the output signal from the output buffers at desired levels. Accordingly, it is unnecessary to supply a false signal to the IC device for testing the IC device. This results in shortening a period of time required for such a testing operation.

What is claimed is:

1. A semiconductor logic integrated circuit device having first and second operation modes with a parallel output terminal and a serial output terminal, said device including:
    logic means having a plurality of output terminals for producing a first parallel output signal in response to an externally generated input signal;
    signal selection means coupled to said logic means for receiving said first parallel output signal, said signal selection means being connected to receive a serial input signal, said signal selection means for producing a serial output signal and for further producing a second parallel output signal;
    a storing means connected between said signal selection means and said parallel output terminal for temporarily storing said second parallel output signal; and
    control means connected to control said signal selection means and said storing means for allowing said first parallel output signal to propagate through said signal selecting means and said storing means as an output signal from said circuit device parallel output terminal in said first operation mode, and for alternately allowing said first parallel output signal to propagate from said serial signal output terminal while simultaneously maintaining the logic levels of the second parallel output signal in said temporary storing means at said circuit device parallel to output terminal when operating in said second operation mode.

2. The circuit device as defined in claim 1 wherein said signal selection means includes a plurality of shift register stages coupled in a cascade connection, said shift register stages being coupled to said corresponding plural output terminals of said logic unit, respectively.

3. The circuit device as defined in claim 2 wherein said storing means comprises a plurality of data latch circuits coupled and corresponding to said plurality of shift register stages, respectively, and connected to receive said second parallel output signal.

4. A semiconductor integrated circuit device including a logic unit having a plurality of output terminals and a corresponding number of output buffers for providing output signals on said logic unit output terminals, respectively, said semiconductor integrated circuit device comprising:
    memory means having an output connected to an input of each said output buffers for selectively temporarily storing data applied at an input thereof;
    a shift register having an output connected to said memory means input and having at least one parallel input terminal;
    first means connected to said shift register for selecting data applied to said shift register parallel input terminal and for controlling said shift register to alternately store said selected data or directly transmit said selected data to said shift register output;
    second means connected to said memory means for controlling said memory means to alternately (a) store data applied to said memory means input and subsequently transmit said stored data to said memory means output, and (b) directly transmit said data applied to said memory means input to said memory means output;
    third means connected to said shift register for controlling said shift register to shift data stored therein and for loading externally supplied serial data into said shift register; and
    fourth means connected to said shift register for sequentially applying data stored in said shift register to aid memory means as serial data.

5. The semiconductor integrated circuit device as claimed in claim 4, wherein said memory means comprises a data latch.

6. The semiconductor integrated circuit device as claimed in claim 4, wherein said shift register comprises a transfer gate and a data latch circuit.

7. A semiconductor integrated circuit comprising:
    plural parallel input terminals I;
    buffered plural parallel output terminals O;
    first logic means connected to said plural input terminals for processing parallel input signals applied to said plural input terminals and for producing parallel output signals P responsive to said parallel input signals;
    a serial output terminal SO; and
    additional testing logic means connected to receive said first logic means parallel output signals P for operating alternating in a normal mode and in a test mode in response to at least one externally generated test control signal, said additional logic means for (a) directly passing said first logic means parallel output signals P to said buffered plural parallel output terminals O when operating in said normal mode, and (b) converting said logic means parallel output signals P to serial output signals and applying said serial output signals to said serial output terminal SO without affecting the signals present at said buffered plural parallel output terminals o when operating in said test mode.

8. A semiconductor integrated circuit as in claim 7 wherein:
    said circuit further includes a serial input data terminal SI; and said further logic means is connected to said serial input data terminal and selectively propagates signals present at said serial input data terminal in sequence to said buffered parallel output data terminals when operating in said test mode.

9. A semiconductor integrated circuit as in claim 7 wherein said further logic means comprises:

shift register means SR connected to receive said first logic means parallel output signals P and also connected to receive said control for operating alternately in a normal mode and in a test mode, said shift register means for passing said first logic means parallel output signals P to plural parallel output terminals Q thereof when operating in said normal mode, said shift register means for converting said first logic means parallel output signals P to serial output signals and for applying said serial output signals to said serial output terminal SO when operating in said test mode; and data latch means L connected between said shift register means plural parallel output terminals Q and said buffered parallel output terminals O and also connected to receive said control signal for preventing the output signals produced at said buffered parallel output terminals O from changing while said shift register means converts said parallel output signals P to serial output signals during operation in said testing mode.

* * * * *